United States Patent
Song

(10) Patent No.: US 8,436,641 B2
(45) Date of Patent: May 7, 2013

(54) CIRCUIT AND METHOD FOR GENERATING ON-DIE TERMINATION SIGNAL AND SEMICONDUCTOR APPARATUS USING THE SAME

(75) Inventor: Choung Ki Song, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 12/968,141

(22) Filed: Dec. 14, 2010

(65) Prior Publication Data

US 2012/0081144 A1    Apr. 5, 2012

(30) Foreign Application Priority Data

Sep. 30, 2010    (KR) .................. 10-2010-0095619

(51) Int. Cl.
*H03K 19/0175*    (2006.01)

(52) U.S. Cl.
USPC ............... 326/30; 326/28; 365/193; 365/194; 365/233.1

(58) Field of Classification Search ...................... 326/30
See application file for complete search history.

(56) References Cited

U.S. PATENT DOCUMENTS

| | | | |
|---|---|---|---|
| 2007/0103188 A1* | 5/2007 | Hosoe et al. | 326/30 |
| 2007/0126468 A1* | 6/2007 | Kim | 326/30 |
| 2008/0164904 A1 | 7/2008 | Kim | |
| 2009/0016124 A1 | 1/2009 | Kim | |
| 2010/0208535 A1* | 8/2010 | Fujisawa | 365/193 |

FOREIGN PATENT DOCUMENTS

| | | |
|---|---|---|
| JP | 2007-115366 | 5/2007 |
| KR | 1020030091233 A | 12/2003 |
| KR | 1020100041199 A | 4/2010 |

* cited by examiner

*Primary Examiner* — Jany Tran
(74) *Attorney, Agent, or Firm* — William Park & Associates Ltd.

(57) ABSTRACT

Various embodiments of an on-die termination (ODT) signal generating circuit are disclosed. In one exemplary embodiment, the ODT signal generating circuit includes a latency unit and an ODT control signal generating unit. The latency unit is configured to receive a clock signal and an ODT signal. The latency unit is configured to delay the ODT signal by a predetermined time to generate a first ODT signal. The latency unit is also configured to delay the ODT signal by less than the predetermined time to generate a second ODT signal. The ODT control signal generating unit is configured to provide either one of the first and second ODT signals as an ODT control signal in response to a control signal.

11 Claims, 6 Drawing Sheets

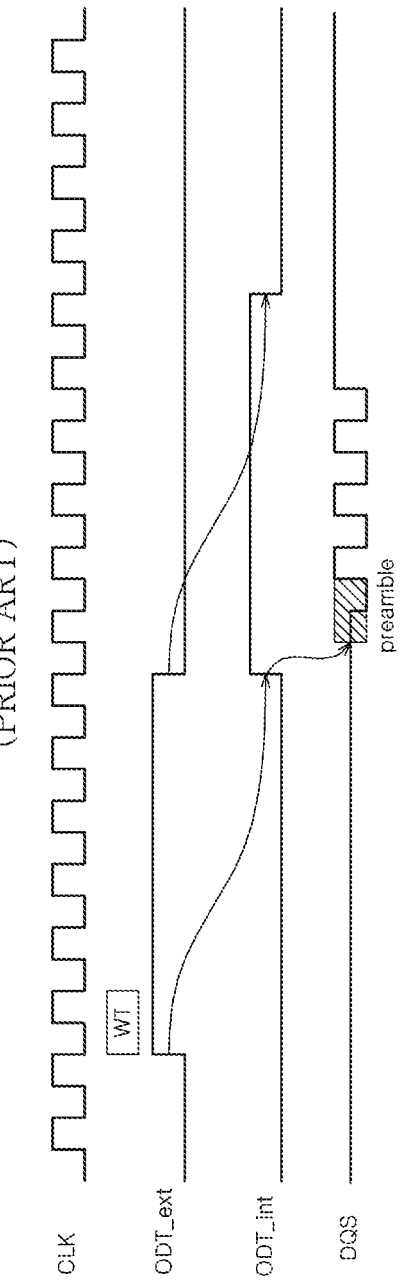
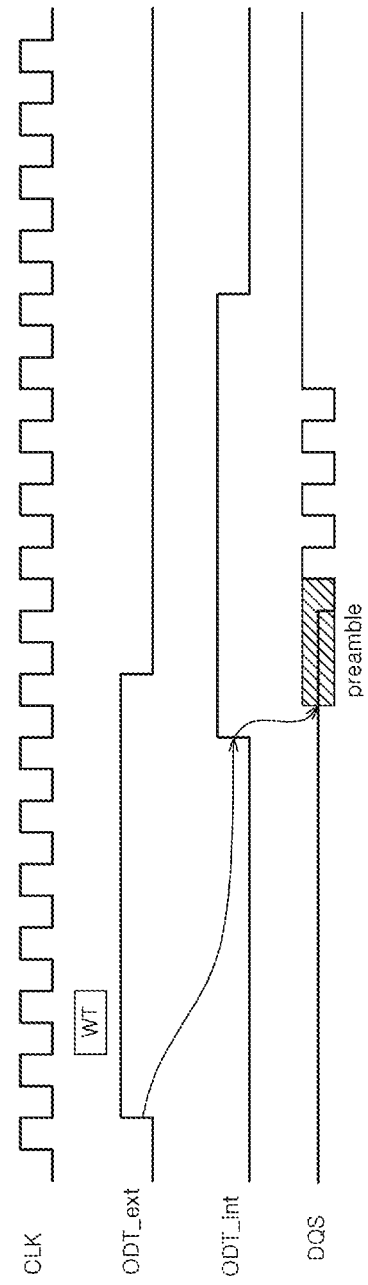

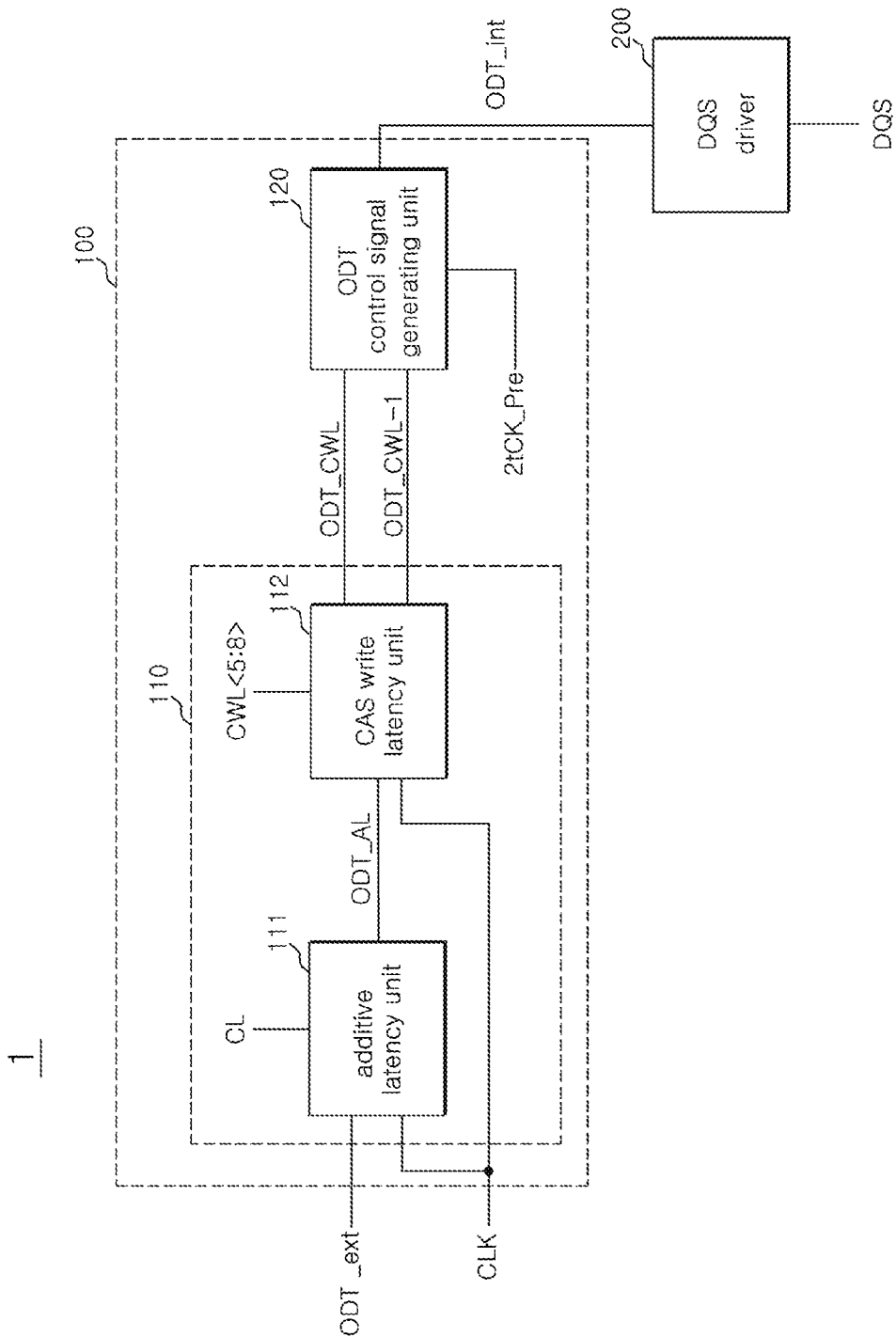

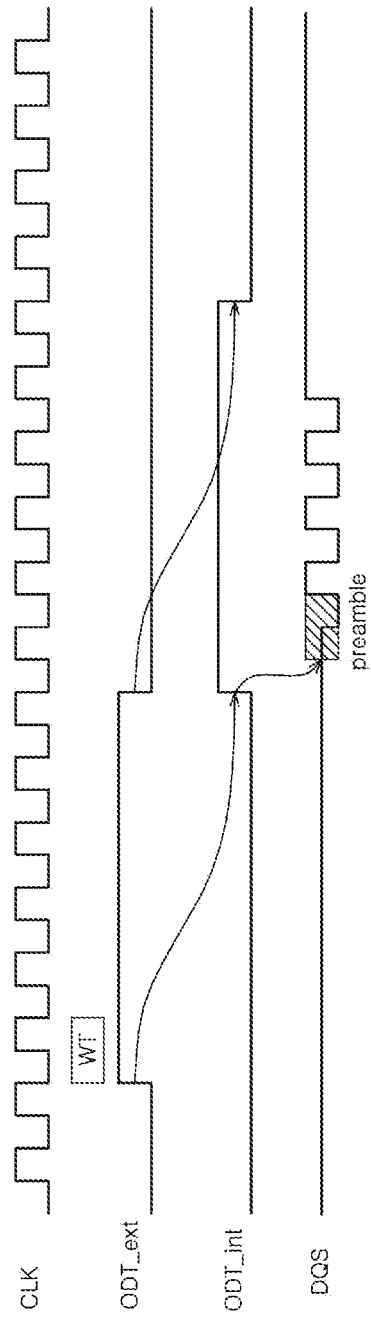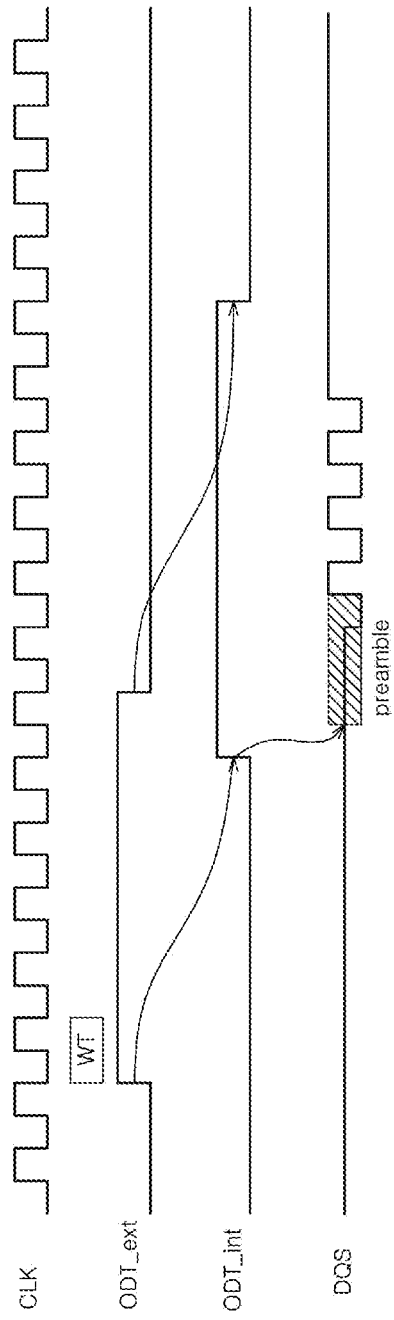

CIRCUIT AND METHOD FOR GENERATING ON-DIE TERMINATION SIGNAL AND SEMICONDUCTOR APPARATUS USING THE SAME

CROSS-REFERENCE TO RELATED APPLICATION

The present application claims priority to Korean Application No. 10-2010-0095619, filed on Sep. 30, 2010, in the Korean Intellectual Property Office, which is incorporated herein by reference in its entirety as if set forth in full.

BACKGROUND OF THE INVENTION

1. Technical Field

Various embodiments relate to a semiconductor apparatus and, more particularly, to a circuit and a method for generating an on-die termination (ODT) signal of a semiconductor apparatus.

2. Related Art

In general, a semiconductor apparatus, and particularly a memory apparatus, performs an impedance matching operation in order to communicate data with a system. In other words, the impedance matching between the memory apparatus and the system is performed so that the data can be smoothly communicated therebetween. Such an impedance matching between the semiconductor apparatus and the system is referred to as an on-die termination (ODT).

FIG. 1 is a block diagram schematically showing a configuration of a conventional ODT signal generating circuit. As shown in FIG. 1, the ODT signal generating circuit includes an ODT pad 11, an ODT buffer 12, a clock pad 21, a clock buffer 22, an additive latency (AL) unit 30, and a column address strobe (CAS) write latency (CWL) unit 40. An external ODT signal ODT_ext is inputted through the ODT pad 11 and the ODT buffer 12, and an external clock signal CLK is inputted through the clock pad 21 and the clock buffer 22. The additive latency unit 30 receives the buffered external ODT signal ODT_ext and the buffered external clock signal CLK, and delays the external ODT signal ODT_ext based on additive latency information. The CAS write latency unit 40 receives the clock signal CLK and an output ODT_AL of the additive latency unit 30, and delays the output ODT_AL of the additive latency unit 30 based on CAS write latency information CWL<5:8> to generate an ODT control signal ODT_int.

FIG. 2 is a diagram showing a configuration of the CAS write latency unit 40 of FIG. 1. As shown in FIG. 2, the CAS write latency unit 40 includes an AND gate 41, first to third multiplexers (MUX) 42, 43 and 44, and first to sixth flip-flops FF1 to FF6 which are coupled in series with one another. The AND gate 41 receives the output ODT_AL of the additive latency unit 30 and the CAS write latency information CWL<8>. The first to third multiplexers 42, 43 and 44 are configured to receive the CAS write latency information CWL<7>, CWL<6> and CWL<5>, respectively, and output either the output ODT_AL of the additive latency unit 30 or the output of the respective one of the first to third flip-flops FF1, FF2 and FF3, which are coupled to the first to third multiplexers 42, 43 and 44, respectively. The first to sixth flip-flops FF1 to FF6 are configured to sequentially delay the output ODT_AL of the additive latency unit 30 in response to the clock signal CLK. The CAS write latency unit 40 delays the output ODT_AL of the additive latency unit 30 by as much as "CWL-2" to output the delayed signal as the ODT control signal ODT_int.

For example, if CWL is 7, the first multiplexer 42 outputs the output ODT_AL of the additive latency unit 30 to the second flip-flop FF2 in response to the CAS write latency information CWL<7>. The output ODT_AL of the additive latency unit 30 can then be delayed by the second to sixth flip-flops FF2 to FF6 by as much as 5 periods of the clock CLK and finally be provided as the ODT control signal ODT_int.

FIGS. 3 and 4 are timing diagrams illustrating exemplary operations of the conventional ODT signal generating circuit. In a memory apparatus, the additive latency (AL) can be determined in relation to a CAS latency (CL), such as, for example, AL=0, AL=CL-1 or AL=CL-2. For purposes of illustrating an exemplary operation, it is assumed that AL=0, CW=7, and burst length (BL)=8.

In FIG. 3, when a write command WT is applied from the system, the external ODT signal ODT_ext is applied at the same time. Since AL=0, the additive latency unit 30 outputs the ODT signal ODT_ext without any delay. Since CWL=7, the CAS write latency unit 40 delays the output ODT_AL of the additive latency unit 30 by as much as 5 periods of the clock CLK to generate the ODT control signal ODT_int. Afterwards, the ODT control signal ODT_int is inputted to an ODT driver (not shown) to be a signal instructing impedance determination and a source signal used for generating a data strobe signal DQS. Accordingly, the data strobe signal DQS is generated in response to the ODT control signal ODT_int. As shown in FIG. 3, when the ODT control signal ODT_int is generated, a preamble of the data strobe signal DQS corresponding to a single clock period is generated and, thereafter, a strobe pulse is generated so that BL=8.

The data strobe signal DQS indicates a timing point at which data is inputted/outputted to smoothly input/output the data. Thus, the data strobe signal DQS prepares for the data input/output operation by generating a preamble before the data is substantially inputted/outputted. Recently, with the increasing operation speed of semiconductor apparatuses, a data transmission speed has also increased. Therefore, it may be difficult to ensure an accurate data input/output operation with only the conventional preamble corresponding to a single clock period. Therefore, there exists a need for generating a preamble corresponding to 2 clock periods so that the semiconductor apparatus can be more stably prepared for the data input/output operation.

FIG. 4 is a timing diagram showing an operation of a conventional ODT signal generating circuit that generates the preamble of the data strobe signal corresponding to 2 clock periods. As shown in FIG. 4, the external ODT signal ODT_ext should be inputted before the write command WT is inputted in order to generate the preamble of the data strobe signal DQS corresponding to 2 clock periods. Requiring the external ODT signal ODT_ext to be inputted before the write command WT may result in a time loss because the write command WT must either be inputted after being delayed in the system or be delayed after being inputted from the system. In addition, it may decrease the channel efficiency between the system and the semiconductor apparatus.

SUMMARY OF THE INVENTION

Accordingly, there is a need for an improved circuit and method for generating an ODT signal that may obviate one or more of the above-mentioned problems or disadvantages. In particular, there is a need for an improved circuit and method for generating an ODT signal that can vary the timing at which an ODT control signal is generated.

In the following description, certain aspects and embodiments will become evident. It should be understood that these aspects and embodiments are merely exemplary, and the invention, in its broadest sense, could be practiced without having one or more features of these aspects and embodiments.

In one exemplary aspect of the present invention, an ODT signal generating circuit may comprises: a latency unit configured to receive a clock signal and an ODT signal, the latency unit being configured to delay the ODT signal by a predetermined time to generate a first ODT signal, the latency unit further being configured to delay the ODT signal by less than the predetermined time to generate a second ODT signal; and an ODT control signal generating unit configured to provide either one of the first and second ODT signals as an ODT control signal in response to a control signal.

In another exemplary aspect, a semiconductor apparatus may comprise: an ODT control signal generating unit configured to delay an ODT signal by a predetermined time to provide the delayed signal as an ODT control signal in a first operation mode, and delay the ODT signal by less than the predetermined time to provide the delayed signal as the ODT control signal in a second operation mode; and a data strobe driver configured to receive the ODT control signal to generate a preamble of a data strobe signal.

Some exemplary aspects of the present invention may provide a method for generating an ODT signal. The method may comprises: receiving an ODT signal from a system; generating a first ODT signal by delaying the ODT signal by a predetermined time; generating a second ODT signal by delaying the ODT signal by less than the predetermined time; and selecting one of the first and second ODT signals as an ODT control signal in response to a control signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

FIG. 3 is a timing diagram illustrating a conventional operation of an ODT signal generating circuit.

FIG. 4 is a timing diagram illustrating another conventional operation of an ODT signal generating circuit.

FIG. 5 is a block diagram schematically illustrating a configuration of a semiconductor apparatus according to one exemplary embodiment.

FIG. 7 is a timing diagram illustrating an exemplary operation of the semiconductor apparatus of FIG. 6 in a first operation mode.

FIG. 8 is a timing diagram illustrating an exemplary operation of the semiconductor apparatus of FIG. 6 in a second operation mode.

DETAILED DESCRIPTION

Figure 1:
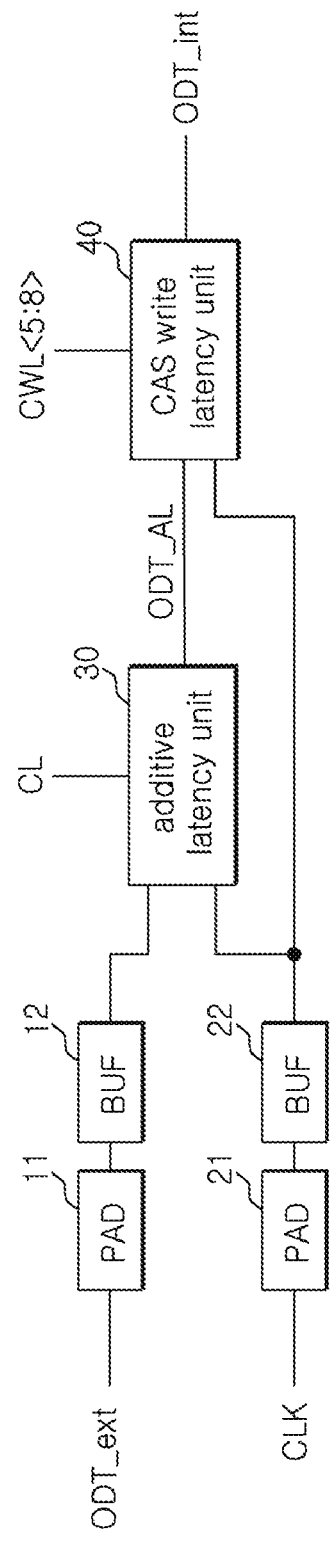
FIG. 1 is a block diagram schematically illustrating a configuration of a conventional ODT signal generating circuit.
Figure 2:
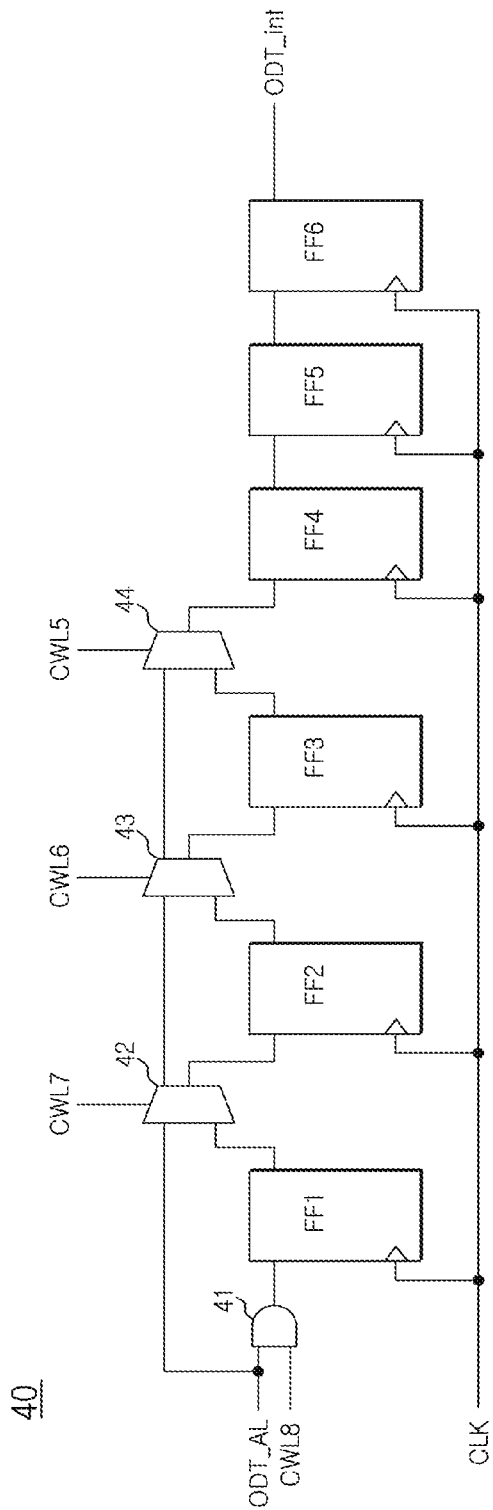
FIG. 2 is a diagram showing a configuration of a CAS write latency unit of FIG. 1.

Reference will now be made in detail to the exemplary embodiments consistent with the present disclosure, examples of which are illustrated in the accompanying drawings. Wherever possible, the same reference characters will be used throughout the drawings to refer to the same or like parts.

FIG. 5 is a block diagram schematically showing a configuration of a semiconductor apparatus according to one exemplary embodiment. As shown in FIG. 5, the semiconductor apparatus 1 may include an ODT signal generating unit 100 and a data strobe driver (DQS driver) 200. The ODT signal generating unit 100 receives an ODT signal 'ODT_ext' and a clock signal CLK to generate an ODT control signal 'ODT_int'. The ODT signal 'ODT_ext' is inputted from a system that has a controller for performing a data input/output operation. The ODT signal 'ODT_ext' is inputted to the semiconductor apparatus 1 through an ODT pad and an ODT buffer (not shown). The clock signal CLK is inputted to the semiconductor apparatus 1 through a clock pad and a clock buffer (not shown).

The ODT signal generating unit 100 delays the ODT signal 'ODT_ext' by a predetermined time period to generate the ODT control signal 'ODT_int'. The ODT signal generating unit 100 may have two operation modes. In the first operation mode, the ODT signal generating unit 100 provides a signal generated by delaying the ODT signal 'ODT_ext' by the predetermined time as the ODT control signal 'ODT_int'. In a second operation mode, the ODT signal generating unit 100 provides a signal generated by delaying the ODT signal 'ODT_ext' by less than the predetermined time as the ODT control signal 'ODT_int'.

In one exemplary embodiment, the predetermined time is a clock period corresponding to latency information. Therefore, the ODT signal generating unit 100 delays the ODT signal 'ODT_ext' by the clock period corresponding to the latency information in the first operation mode, and delays the ODT signal 'ODT_ext' by less than the clock period corresponding to the latency information in the second operation mode.

The first and second operation modes can be discriminated from each other based on an operation speed of the semiconductor apparatus 1. For example, a case where the semiconductor apparatus 1 receives a clock having a longer period to operate in a lower speed may correspond to the first operation mode, and a case where the semiconductor apparatus 1 receives a clock having a shorter period than in the first operation mode to operate in a higher speed than in the first operation mode may correspond to the second operation mode.

The ODT signal generating unit 100 includes a latency unit 110 and an ODT control signal generating unit 120. The latency unit 110 receives the ODT signal 'ODT_ext' and the clock signal CLK to generate a first ODT signal 'ODT_CWL' and a second ODT signal 'ODT_CWL-1'. The latency unit 110 delays the ODT signal 'ODT_ext' by as much as the clock period corresponding to latency information to generate the first ODT signal 'ODT_CWL', and delays the ODT signal 'ODT_ext' by less than the clock period corresponding to the latency information to generate the second ODT signal 'ODT_CWL-1'. Therefore, the second ODT signal 'ODT_CWL-1' can be enabled earlier than the first ODT signal 'ODT_CWL'. The latency includes an additive latency (AL) and CAS write latency (CWL) CWL<5:8>.

The latency unit 110 includes an additive latency unit 111 and a CAS write latency unit 112. The additive latency unit 111 receives the ODT signal 'ODT_ext' and the clock signal CLK. The additive latency unit 111 delays the ODT signal 'ODT_ext' by a clock period corresponding to the additive latency information and outputs the delayed ODT signal 'ODT_AL'.

The additive latency (AL) may be defined by a CAS latency (CL). The CAS write latency unit 112 receives the clock CLK and the output 'ODT_AL' of the additive latency unit 111. The CAS write latency unit 112 delays and outputs the output 'ODT_AL' of the additive latency unit 111 by a clock period corresponding to the CAS write latency information CWL<5:8>.

In particular, the CAS write latency unit 112 delays the output 'ODT_AL' of the additive latency unit 111 by the clock period corresponding to the CAS write latency information CWL<5:8> to generate the first ODT signal 'ODT_CWL', and delays the output 'ODT_AL' of the additive latency unit 111 by less than the clock period corresponding to the CAS write latency information CWL<5:8> to generate the second ODT signal 'ODT_CWL-1'.

Since the semiconductor apparatus 1 of the present embodiment includes the latency unit 110 having the additive latency unit 111 and the CAS write latency unit 112, the semiconductor apparatus 1 can generate both the first ODT signal 'ODT_CWL' delayed by the predetermined time and the second ODT signal 'ODT_CWL-1' delayed by less than the predetermined time.

The ODT control signal generating unit 120 receives the first and second ODT signals 'ODT_CWL' and 'ODT_CWL-1' and a control signal 2tCK_Pre to generate the ODT control signal 'ODT_int'. The ODT control signal generating unit 120 provides either one of the first and second ODT signals 'ODT_CWL' and 'ODT_CWL-1' as the ODT control signal 'ODT_int' in response to the control signal '2tCK_Pre'.

The control signal '2tCK_Pre' is a signal that can designate either the first operation mode or the second operation mode. In one exemplary embodiment, the control signal '2tCK_Pre' may be a signal applied from a Mode Register Set (MRS) of the semiconductor apparatus.

In various exemplary embodiments, the control signal '2tCK_Pre' may be a signal that is enabled to designate the second operation mode. The ODT control signal generating unit 120 outputs the first ODT signal 'ODT_CWL' as the ODT control signal 'ODT_int' if the control signal '2tCK_Pre' is disabled, and outputs the second ODT signal 'ODT_CWL-1' as the ODT control signal 'ODT_int' if the control signal '2tCK_Pre' is enabled. Thus, the semiconductor apparatus 1 can generate the ODT control signal 'ODT_int' either delayed by the predetermined time in the first operation mode or delayed by less than the predetermined time. Accordingly, the ODT control signal 'ODT_int' in the second operation mode may be enabled at a timing earlier than a timing at which the ODT control signal 'ODT_int' in the first operation mode is enabled.

The data strobe driver 200 receives the ODT control signal 'ODT_int' from the ODT signal generation unit 100 to generate a data strobe signal 'DQS'. The data strobe signal 'DQS' is a signal generated so that the data input/output operation can be performed smoothly between the system and the semiconductor apparatus 1.

The data strobe driver 200 receives a clock signal (e.g., a delay-locked loop (DLL) clock signal) to generate the data strobe signal 'DQS' if the ODT control signal 'ODT_int' is enabled. In response to the ODT control signal 'ODT_int', the data strobe driver 200 generates a preamble at a timing earlier than a timing at which data is substantially inputted/outputted and, thereby, makes the semiconductor apparatus 1 be ready for the data input/output operation.

Since the data strobe driver 200 receives the ODT control signal 'ODT_int', which may have two different enable timings (depending on the operation mode of the semiconductor apparatus 1 designated by the ODT control signal generating unit 120), the length of the preamble can be varied based on the operation mode of the semiconductor apparatus 1. For example, the data strobe driver 200 can generate the preamble of the data strobe signal 'DQS' in the second operation mode earlier than in the first operation mode.

Figure 6:
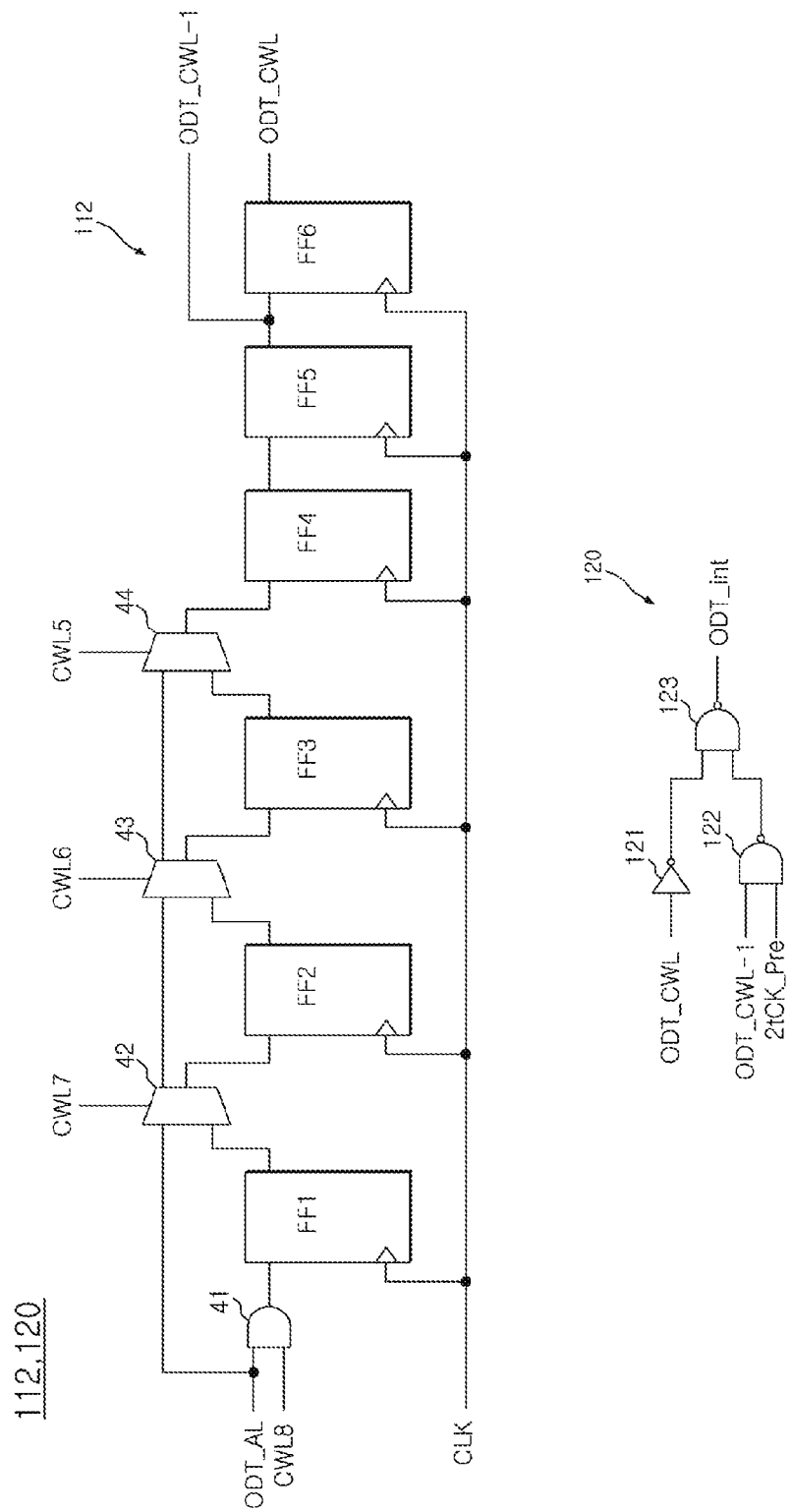
FIG. 6 is a diagram illustrating a connection and a configuration of a CAS write latency unit and an ODT control signal generating unit of FIG. 5.

FIG. 6 is a diagram illustrating an exemplary configuration of the CAS write latency unit 112 and the ODT control signal generating unit 120 of FIG. 5. As shown in FIG. 6, the CAS write latency unit 112 includes an AND gate 41, first to third multiplexers 42, 43 and 44, and first to sixth flip-flops FF1 to FF6 coupled in series with one another. Based on the CAS write latency information CWL<5:8>, the CAS write latency unit 112 can delay the output 'ODT_AL' of the additive latency unit 111 by as much as the clock period corresponding to the CAS write latency information CWL<5:8> to generate the first ODT signal 'ODT_CWL', and can delay the output 'ODT_AL' of the additive latency unit 111 by less than the clock period corresponding to the CAS write latency information CWL<5:8> to generate the second ODT signal 'ODT_CWL-1' from the flip-flop FF5 which is placed prior to the last flip-flop FF6 configured to output the first ODT signal 'ODT_CWL'.

The ODT control signal generating unit 120 receives the first and second ODT signals 'ODT_CWL' and 'ODT_CWL-1' and a control signal '2tCK_Pre' to generate the ODT control signal 'ODT_int'. As shown in FIG. 6, the ODT control signal generating unit 120 includes a first inverter 121, a first NAND gate 122, and a second NAND gate 123. The first inverter 121 receives the first ODT signal 'ODT_CWL'. The first NAND gate 122 receives the second ODT signal 'ODT_CWL-1' and the control signal '2tCK_Pre'. The second NAND gate 123 receives outputs of the first inverter 121 and the first NAND gate 122 to generate the ODT control signal 'ODT_int'. Therefore, the ODT control signal generating unit 120 can output the first ODT signal 'ODT_CWL' as the ODT control signal 'ODT_int' if the control signal '2tCK_Pre' is disabled, and can output the second ODT signal 'ODT_CWL-1' as the ODT control signal 'ODT_int' if the control signal '2tCK_Pre' is enabled.

FIG. 7 is a timing diagram illustrating an operation of the semiconductor apparatus 1 in the first operation mode, and FIG. 8 is a timing diagram illustrating an operation of the semiconductor apparatus 1 in the second operation mode according to one exemplary embodiment.

Referring to FIG. 7, a write command WT and an ODT signal 'ODT_ext' are inputted from the system to perform a write operation. The latency unit 110 delays the ODT signal 'ODT_ext' based on the additive latency and the CAS write latency information CWL<5:8> and generates the first and second ODT signals 'ODT_CWL' and 'ODT_CWL-1'. Since the control signal '2tCK_Pre' is disabled in the first operation mode, the ODT control signal generating unit 120 provides the first ODT signal 'ODT_CWL' as the ODT control signal 'ODT_int'. The data strobe driver 200 receives the ODT control signal 'ODT_int' to generate the preamble of the data strobe signal 'DQS'. Since the data strobe driver 200 receives the ODT control signal 'ODT_int' based on the first ODT signal 'ODT_CWL', the data strobe driver 200 can generate the preamble corresponding to a single clock period as shown in FIG. 7.

Referring to FIG. 8, since the control signal '2tCK_Pre' is enabled in the second operation mode, the ODT control signal generating unit 120 provides the second ODT signal 'ODT_CWL-1' as the ODT control signal 'ODT_int'. The data strobe driver 200 receives the ODT control signal 'ODT_int' to generate the preamble of the data strobe signal 'DQS'. Since the data strobe driver 200 receives the ODT control signal 'ODT_int' based on the second ODT signal 'ODT_CWL-1', the data strobe driver 200 can generate the preamble corresponding to 2 clock periods as shown in FIG. 8.

In general, the preamble corresponding to a single clock period is generated for a data input/output operation of a semiconductor apparatus. However, as the operation speed of the semiconductor apparatus increases, the preamble corresponding to 2 clock periods is needed to perform the data input/output operation stably. In the prior art, the semiconductor apparatus should receive the ODT signal from the system earlier than the write command in order to generate the preamble corresponding to 2 clock periods. In various exemplary embodiments of the present invention, however, the timing at which the ODT control signal is generated can be controlled regardless of the input timing of the ODT signal, thereby the length of the preamble of the data strobe signal can be freely controlled.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A semiconductor apparatus comprising:
   an ODT control signal generating unit configured to delay an ODT signal by a predetermined time to provide the delayed signal as an ODT control signal in a first operation mode, and delay the ODT signal by less than the predetermined time to provide the delayed signal as the ODT control signal in a second operation mode; and
   a data strobe driver configured to receive the ODT control signal to generate a preamble of a data strobe signal,
   wherein the pulse width of the preamble generated in the first operation mode is shorter than the pulse width of the preamble generated in the second operation mode.

2. The semiconductor apparatus of claim 1, wherein the semiconductor apparatus is configured to operate in a higher speed in the second operation mode than in the first operation mode.

3. The semiconductor apparatus of claim 1, wherein the predetermined time comprises a clock period corresponding to latency information.

4. The semiconductor apparatus of claim 3, wherein ODT signal generating unit includes:

a latency unit configured to delay the ODT signal by the clock period corresponding to the latency information to generate a first ODT signal and delay the ODT signal by less than the clock period corresponding to the latency information to generate a second ODT signal; and an ODT control signal generating unit configured to output the first ODT signal in the first operation mode and output the second ODT signal in the second operation mode.

5. The semiconductor apparatus of claim 4, wherein the first and second operation modes are designated based on a control signal inputted to generate the preamble of the data strobe signal corresponding to 2 clock periods.

6. The semiconductor apparatus of claim 5, wherein the control signal is applied from a Mode Register Set (MRS).

7. The semiconductor apparatus of claim 4, wherein the latency information comprises an additive latency information and a CAS write latency information, and the latency unit comprises:

an additive latency unit configured to delay the ODT signal by a clock period corresponding to the additive latency information; and a CAS write latency unit configured to receive an output of the additive latency unit and delay the output of the additive latency unit by a clock period corresponding to the CAS write latency information.

8. The semiconductor apparatus of claim 7, wherein the CAS write latency unit is configured to delay the output of the additive latency unit by the clock period corresponding to the CAS write latency information to generate the first ODT signal, and delay the output of the additive latency unit by less than the clock period corresponding to the CAS write latency information to generate the second ODT signal.

9. A method for generating an ODT signal comprising:
   receiving an ODT signal from a system;
   generating a first ODT signal by delaying the ODT signal by a predetermined time in synchronization with a clock signal;
   generating a second ODT signal by delaying the ODT signal by less than the predetermined time in synchronization with a clock signal; and
   selecting the first ODT signal as an ODT control signal in a first operation mode and selecting the second ODT signal as the ODT control signal in a second mode signal,
   wherein the second operation mode is configured to operate at a higher speed than the first operation mode.

10. The method of claim 9, wherein the predetermined time comprises a clock period corresponding to latency information.

11. The method of claim 10, wherein the control signal is applied from a Mode Register Set (MRS) and is configured to designate the first and second operation modes for selecting one of the first and second ODT signals.

* * * * *